United States Patent
Shen et al.

(10) Patent No.: US 7,981,725 B2
(45) Date of Patent: Jul. 19, 2011

(54) FABRICATING PROCESS OF A CHIP PACKAGE STRUCTURE

(75) Inventors: Geng-Shin Shen, Tainan County (TW); David Wei Wang, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 0 days.

(21) Appl. No.: 12/714,646

(22) Filed: Mar. 1, 2010

(65) Prior Publication Data

US 2010/0151624 A1    Jun. 17, 2010

Related U.S. Application Data

(60) Continuation of application No. 12/169,120, filed on Jul. 8, 2008, now Pat. No. 7,749,806, which is a continuation-in-part of application No. 11/361,646, filed on Feb. 24, 2006, now abandoned, which is a division of application No. 11/234,774, filed on Sep. 22, 2005, now abandoned.

(51) Int. Cl.
    *H01L 21/00* (2006.01)
(52) U.S. Cl. .................. 438/108; 257/E21.503
(58) Field of Classification Search .................. 156/312; 257/E21.503, E21.511, E21.505
    See application file for complete search history.

(56) References Cited

U.S. PATENT DOCUMENTS

| | | | |
|---|---|---|---|
| 6,168,972 B1 | 1/2001 | Wang et al. | 438/108 |
| 6,252,301 B1 * | 6/2001 | Gilleo et al. | 257/690 |
| 6,311,888 B1 * | 11/2001 | Funada et al. | 228/106 |
| 6,410,415 B1 | 6/2002 | Estes et al. | 438/612 |
| 7,579,211 B2 * | 8/2009 | Ohuchi | 438/106 |
| 7,683,482 B2 * | 3/2010 | Nishida et al. | 257/737 |
| 2001/0051392 A1 | 12/2001 | Akram | 438/106 |
| 2003/0049425 A1 * | 3/2003 | Ono et al. | 428/217 |
| 2004/0101991 A1 * | 5/2004 | Hiatt et al. | 438/106 |

(Continued)

FOREIGN PATENT DOCUMENTS

CN    1956179    5/2007

OTHER PUBLICATIONS

Chinese First Examination Report of China Patent Application No. 200810214686.9, dated Apr. 16, 2010.

*Primary Examiner* — Matthew C Landau
*Assistant Examiner* — Latanya Crawford
(74) *Attorney, Agent, or Firm* — J.C. Patents

(57) ABSTRACT

A fabricating process of a chip package structure is provided. First, a first substrate having a plurality of first bonding pads and a second substrate having a plurality of second bonding pads are provided, wherein bumps are formed on the first bonding pads of the first substrate. A first two-stage adhesive layer is formed on the first substrate and is B-stagized to form a first B-staged adhesive layer. A second two-stage adhesive layer is formed on the second substrate and is B-stagized to form a second B-staged adhesive layer. Then, the first substrate and the second substrate are bonded via the first and second B-staged adhesive layer such that the bumps pierce through the second B-staged adhesive layer and are electrically connected to the second bonding pads, wherein each of the first bonding pads is respectively electrically connected to one of the second bonding pads via one of the bumps.

23 Claims, 19 Drawing Sheets

U.S. PATENT DOCUMENTS

| | | | |
|---|---|---|---|
| 2004/0185601 A1* | 9/2004 | Stepniak et al. | 438/108 |
| 2005/0116353 A1* | 6/2005 | Fujitani et al. | 257/778 |
| 2005/0212131 A1* | 9/2005 | Kawai | 257/737 |
| 2005/0221532 A1* | 10/2005 | Chee | 438/106 |
| 2007/0148817 A1 | 6/2007 | Williams et al. | 438/106 |
| 2007/0215992 A1* | 9/2007 | Shen et al. | 257/668 |
| 2008/0044951 A1* | 2/2008 | Bang et al. | 438/121 |

* cited by examiner

US 7,981,725 B2

FABRICATING PROCESS OF A CHIP PACKAGE STRUCTURE

CROSS-REFERENCE TO RELATED APPLICATION

This application is a continuation application of and claims the priority benefit of the prior application Ser. No. 12/169,120, filed on Jul. 8, 2008, now pending. The prior application Ser. No. 12/169,120 is a continuation in part application of and claims the priority benefit of a prior application Ser. No. 11/361,646, filed on Feb. 24, 2006. The prior application Ser. No. 11/361,646 is a divisional application of and claims the priority benefit of a prior application Ser. No. 11/234,774, filed on Sep. 22, 2005. The entirety of each of the above-mentioned patent applications is hereby incorporated by reference herein and made a part of this specification.

BACKGROUND OF THE INVENTION

1. Field of the Invention

The present invention generally relates to a fabricating process of a chip package structure. More particularly, the present invention relates to a fabricating process of a chip package structure utilizing at least two B-staged adhesive layers to bond substrates.

2. Description of Related Art

Following the increase of input/output contacts of an integrated circuit, chip package technology has become more and more diversified. This is due to the fact that Flip Chip (FC) Interconnect technology minimizes the thickness of the chip package, and reduces signal transmission path, etc. The most common used chip package structures applying the flip chip interconnect technology is, for example, Flip Chip Ball Grid Array (FC/BGA) package and the Flip Chip Pin Grid Array (FC/PGA) package.

Flip chip interconnect technology employs the method of defining area array by disposing a plurality of bonding pads onto the active surface of the chip and forming a plurality of bumps on the bonding pads, respectively. Next, the chip is flipped to connect the bonding bumps of the chip and a plurality of contact pads disposed on a carrier such as a circuit substrate. Therefore, the chip is electrically and mechanically connected to the carrier through the bumps. Further, the chip can be electrically connected to external electronic devices via the internal circuits of the carrier. Generally speaking, the bumps has several types such as the solder bump, the gold bump, the copper bump, the conductive polymer bump, the polymer bump, etc.

FIG. 1 is a schematic cross-sectional view showing a flip chip package structure having polymer bumps. Referring to FIG. 1, the flip chip package structure 100 comprises a substrate 110, a plurality of polymer bumps 120, a chip 130 and solder 140. The substrate 110 has a surface 110a and a plurality of contact pads 112 disposed on the surface 110a. The chip 130 has an active surface 130a and a plurality of bonding pads 132 disposed on the active surface 130a. The polymer bumps 120 made of polymer material with conductive property are respectively arranged between the contact pads 112 and the bonding pads 132 for electrically connecting the substrate 110 and the chip 130. The surface A of the solder 140 is adhered to the contact pad 112 and the surface B of the solder 140 is adhered to the polymer bump 120. Therefore, when external force or thermal stress (not shown) is applied to the flip chip package structure 100, the solder 140 may peel from the contact pads 112 such that the polymer bumps 120 can not be electrically connected to the contact pads 112. Obviously, the reliability of the flip chip package structure 100 is lower.

SUMMARY OF THE INVENTION

The present invention is to provide a fabricating process of a chip package structure having enhanced reliability.

As embodied and broadly described herein, the present invention provides a fabricating process of a chip package structure. First, a first substrate having a plurality of first bonding pads and a second substrate having a plurality of second bonding pads are provide, wherein a plurality of bumps are formed on the first bonding pads of the first substrate. A first two-stage adhesive layer is formed on the first substrate and is B-stagized (i.e. pre-cured or partially cured) to form a first B-staged adhesive layer. A second two-stage adhesive layer is formed on the second substrate and is B-stagized to form a second B-staged adhesive layer. Then, the first substrate and the second substrate are bonded via the first B-staged adhesive layer and the second B-staged adhesive layer such that the bumps pierce through the second B-staged adhesive layer and are electrically connected to the second bonding pads, wherein each of the first bonding pads is respectively electrically connected to one of the second bonding pads via one of the bumps. The method of B-stagization the first two-stage adhesive layer and the second two-stage adhesive layer includes heating (thermal curing) or UV curing.

According to an embodiment of the present invention, the first substrate and the second substrate are both chips.

According to an embodiment of the present invention, the first substrate is a carrier and the second substrate is a chip.

According to an embodiment of the present invention, the first substrate is a chip and the second substrate is a carrier.

According to an embodiment of the present invention, the bumps are stud bumps formed by wire bonder or plating bumps formed by plating process. The bumps are gold bumps, copper bumps, or solder bumps.

According to an embodiment of the present invention, the first two-stage adhesive layer is formed by screen printing, painting, spraying, spin-coating, or dipping.

According to an embodiment of the present invention, the second two-stage adhesive layer is formed by screen printing, painting, spraying, spin-coating, or dipping.

According to an embodiment of the present invention, the method for forming the first B-staged adhesive layer comprises forming a plurality of first two-stage adhesive pillars to surround the bumps; and B-stagizing (i.e. pre-curing or partially curing) the first two-stage adhesive pillars to form a plurality of first B-staged adhesive pillars.

According to an embodiment of the present invention, the method for forming the second B-staged adhesive layer comprises forming a plurality of second two-stage adhesive pillars on the second bonding pads; and B-stagizing the second two-stage adhesive pillars to form a plurality of second B-staged adhesive pillars.

According to an embodiment of the present invention, each of the second bonding pads is entirely covered by one of the second B-staged adhesive pillars, respectively. In an alternative embodiment, the first B-staged adhesive pillars are conductive while the second B-staged adhesive pillars are conductive or non-conductive. In another embodiment, the first B-staged adhesive pillars are non-conductive while the second B-staged adhesive pillars are conductive or non-conductive. Some conductive particles (e.g. silver particles, copper particles, gold particles) are doped in the first B-staged adhesive layer or the second B-staged adhesive layer to enable the first B-staged adhesive layer or the second B-staged adhesive layer being conductive.

According to an embodiment of the present invention, the second two-stage adhesive layer is entirely formed on the second substrate, and a method for forming the first B-staged adhesive layer comprises forming a plurality of first two-stage adhesive pillars to surround the bumps; and B-stagizing the first two-stage adhesive pillars to form a plurality of first B-staged adhesive pillars.

According to an embodiment of the present invention, the first two-stage adhesive layer is entirely formed on the first substrate except areas occupied by the bumps, and a method for forming the second B-staged adhesive layer comprises forming a plurality of second two-stage adhesive pillars on the second bonding pads; and B-stagizing the second two-stage adhesive pillars to form a plurality of second B-staged adhesive pillars.

According to an embodiment of the present invention, composition of the first B-staged adhesive layer is different from or substantially the same with that of the second B-staged adhesive layer.

According to an embodiment of the present invention, the first two-stage adhesive layer and the second two-stage adhesive layer are B-stagized sequentially to form the first B-staged adhesive layer and the second B-staged adhesive layer.

According to an embodiment of the present invention, the first two-stage adhesive layer and the second two-stage adhesive layer are B-stagized simultaneously to form the first B-staged adhesive layer and the second B-staged adhesive layer.

In the fabricating process of a chip package structure of the present invention, the first B-staged adhesive layer and the second B-staged adhesive layer are formed on the first substrate and the second substrate, respectively, such that the bumps disposed between the first substrate and the second substrate can be encapsulated thereby. When an external force or thermal stress is applied to the chip package structure, the first two-stage adhesive layer and the second two-stage adhesive layer are capable of preventing the bumps from damage, such that reliability of the chip package structure is further enhanced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
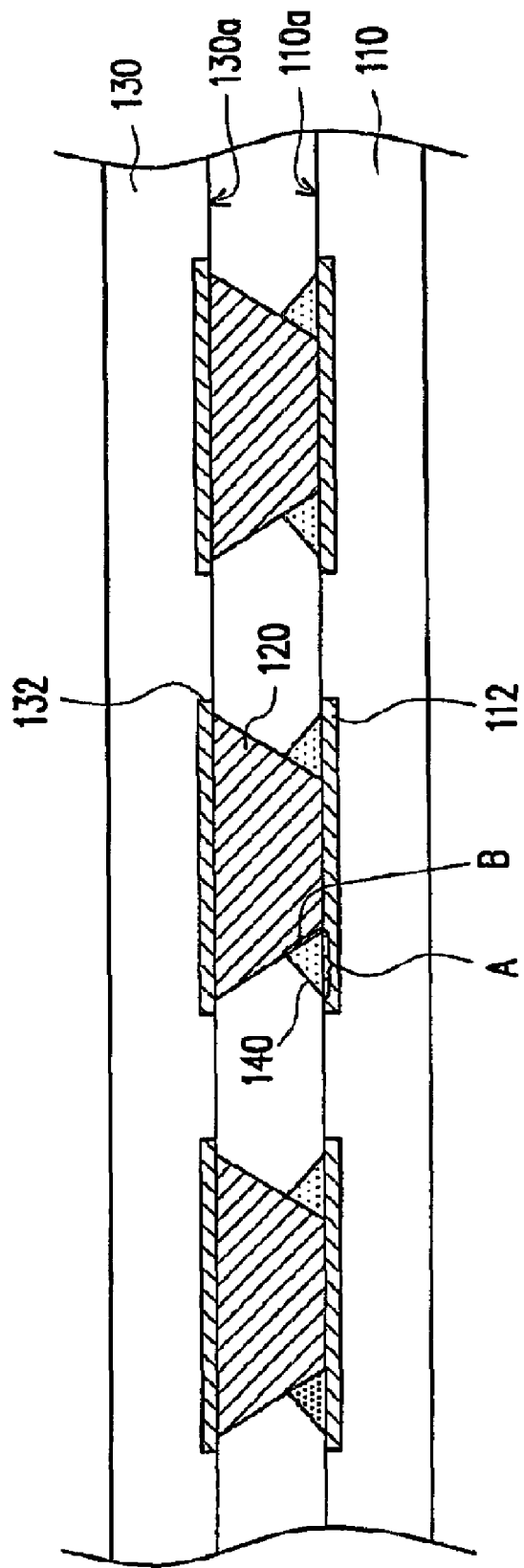
FIG. 1 is a schematic cross-sectional view showing a flip chip package structure having polymer bumps.

Reference will now be made in detail to the present embodiments of the invention, examples of which are illustrated in the accompanying drawings. Wherever possible, the same reference numbers are used in the drawings and the description to refer to the same or like parts.

Figure 2A:
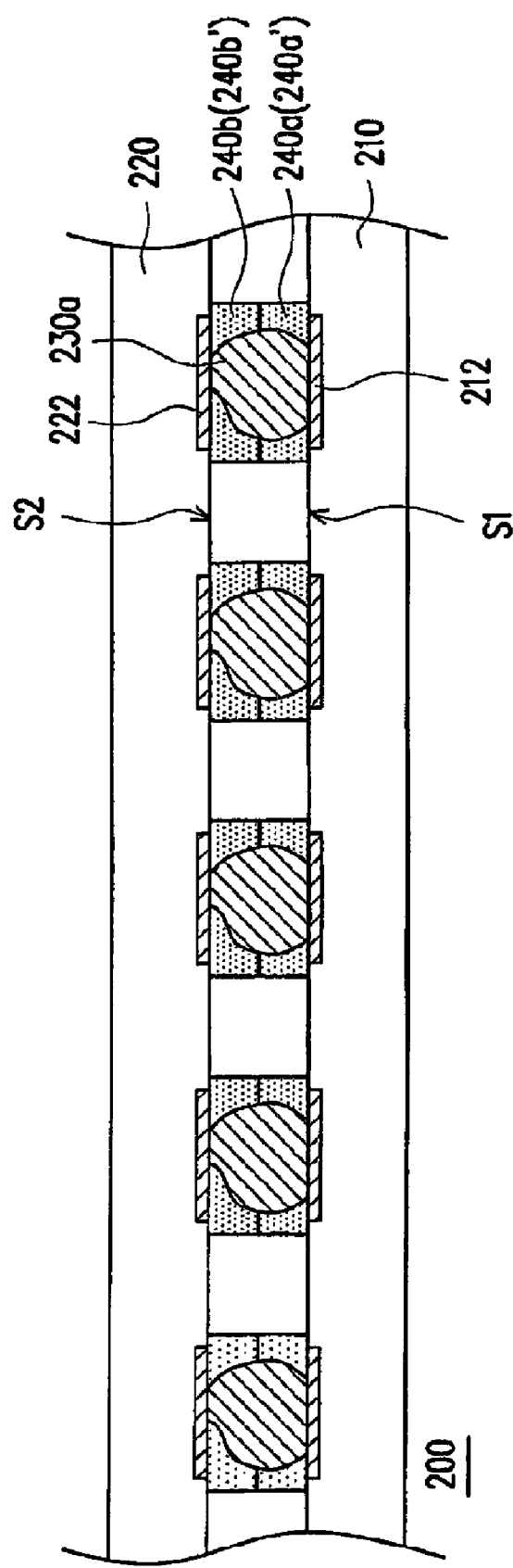
FIG. 2A and FIG. 2B are schematic cross-sectional views illustrating chip package structures according to an embodiment of the present invention.
Figure 2B:
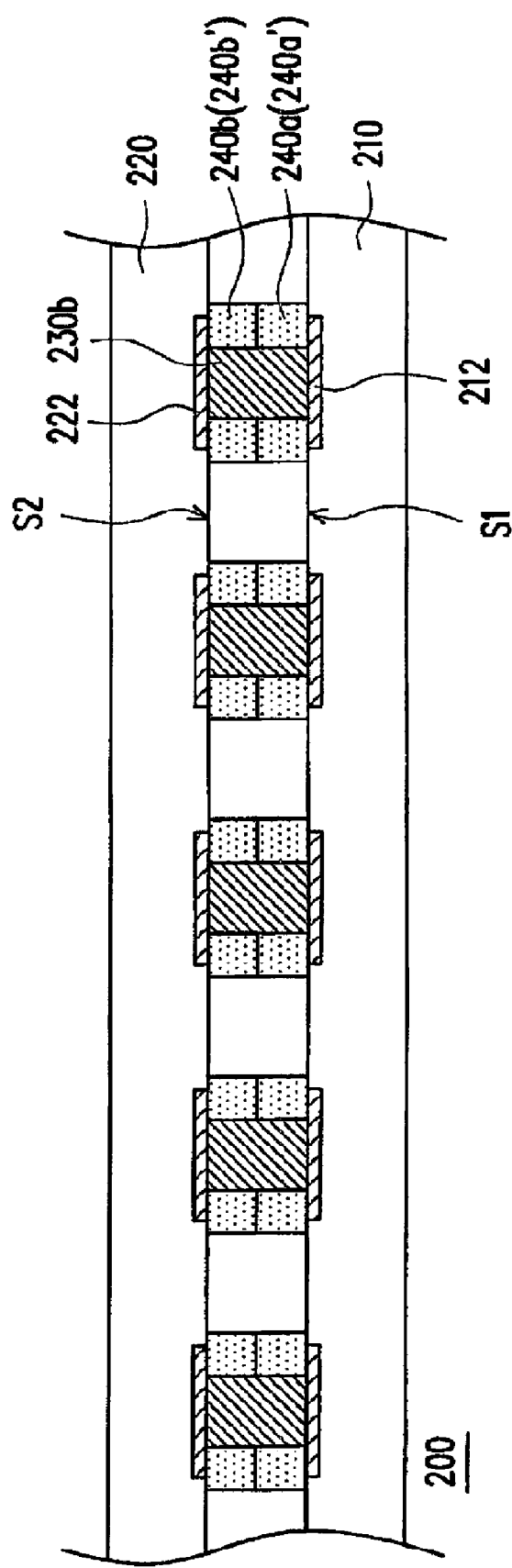

FIG. 2A and FIG. 2B are schematic cross-sectional views illustrating chip package structures according to an embodiment of the present invention. Referring to FIG. 2A and FIG. 2B, the chip package structure 200 of the present invention comprises a first substrate 210, a second substrate 220, a plurality of bumps 230, a first B-staged adhesive layer 240a and a second B-staged adhesive layer 240b. The first substrate 210 has a plurality of first bonding pads 212. The second substrate 220 has a plurality of second bonding pads 222, and the second substrate 220 is disposed above the first substrate 210. The bumps 230 are disposed between the first substrate 210 and the second substrate 220, wherein each of the first bonding pads 212 is respectively electrically connected to one of the second bonding pads 222 via one of the bumps 230. The first B-staged adhesive layer 240a is adhered on the first substrate 210. The second B-staged adhesive layer 240b is adhered between the first B-staged adhesive layer 240a and the second substrate 220, wherein the first B-staged adhesive layer 240a and the second B-staged adhesive layer 240b encapsulate the bumps 230. Additionally, composition of the first B-staged adhesive layer 240a can be substantially the same with that of the second B-staged adhesive layer 240b. As shown in FIG. 2A and FIG. 2B, the first B-staged adhesive layer 240a is adhered on the surface S1 of the first substrate 210 and the second B-staged adhesive layer 240b is adhered on the surface S2 of the second substrate 220. It is noted that the invention utilizes the first B-staged adhesive layer 240a and the second B-staged adhesive layer 240b to enhance the adhesion between the first substrate 210 and the second substrate 220, such that reliability of the chip package structure 200 can be enhanced.

As shown in FIG. 2A and FIG. 2B, in the present embodiment, the thickness of the first B-staged adhesive layer 240a is substantially equal to the thickness of the second B-staged adhesive layer 240b. However, base on actual design requirements, the thickness of the first B-staged adhesive layer 240a may also be different from that of the second B-staged adhesive layer 240b.

The first substrate 210 comprises a plurality of first bonding pads 212 arranged on a surface S1 thereof. The second substrate 220 is arranged above the first substrate 210 and also comprises a plurality of second bonding pads 222 arranged on a surface S2 thereof. According to the present embodiment, the first substrate 210 and the second substrate 220 can be both chips. In another embodiment of the invention, one of the first substrate 210 and the second substrate 220 is a chip. The types of the first substrate 210 and the second substrate 220 are not limited in the present invention. The bumps 230 are arranged between the first bonding pads 212 and the second bonding pads 222. Specifically, the upper end of each bump 230 contacts with the second bonding pad 222 and the lower end of each bump 230 contacts with the first bonding pads 212.

In the present embodiment, the bumps 230 are stud bumps 230a (shown in FIG. 2A), and the stud bumps 230a can be gold stud bumps or copper stud bumps. In another embodiment of the present invention, the bumps 230 may be plating bumps 230b (shown in FIG. 2B). The plating bumps 230b may be gold bumps, copper bumps or other conductive bumps. Each of the stud bumps 230a or each of the plating bumps 230b is encapsulated by one of the adhesive pillars 240a', 240b'.

According to the present embodiment, the first B-staged adhesive layer 240a comprises a plurality of first B-staged adhesive pillars 240a' and the second B-staged adhesive layer 240b comprises a plurality of second B-staged adhesive pillars 240b', wherein the first B-staged adhesive pillars 240a' are adhered on the surface S1 of the first substrate 210 and the second B-staged adhesive pillars 240b' are adhered on the surface S2 of the second substrate 220. In the present embodiment, the first B-staged adhesive pillars 240a' are conductive or non-conductive while the second B-staged adhesive pillars 240b' are conductive or non-conductive. Since the first B-staged adhesive pillars 240a' are electrically insulated from one another and the second B-staged adhesive pillars 240b' are electrically insulated from one another, the short circuit between the bumps 230 can be prevented even though the first B-staged adhesive pillars 240a' and the second B-staged adhesive pillars 240b' are both conductive.

In the present embodiment, the first B-staged adhesive layer 240a and the second B-staged adhesive layer 240b can be obtained from 8008 or 8008HT of ABLESTIK, and the glass transition temperature of which is between about 80° C. and about 300° C. Additionally, the first B-staged adhesive layer 240a and the second B-staged adhesive layer 240b can be obtained from 6200, 6201 or 6202C of ABLESTIK or obtained from SA-200-6, SA-200-10 provided by HITACHI Chemical CO., Ltd., and the glass transition temperature of which is between about −40° C. and about 150° C. The glass transition temperature of the first B-staged adhesive layer 240a is greater than, equal to or smaller than the glass transition temperature of the second B-staged adhesive layer 240b. Additionally, some conductive particles (e.g. silver particles, copper particles, gold particles) are doped in the first B-staged adhesive layer 240a and the second B-staged adhesive layer 240b, for example.

Figure 3A:
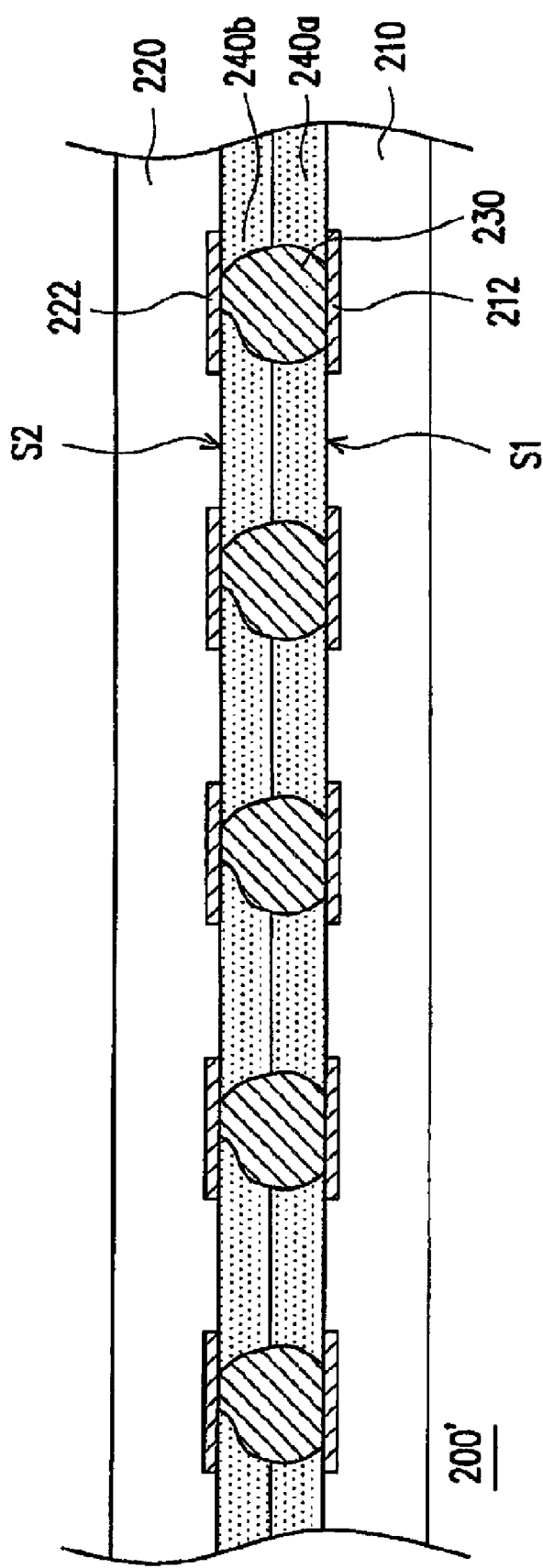
FIG. 3A to FIG. 3D are schematic cross-sectional views illustrating chip package structures according to another embodiment of the present invention.
Figure 3B:
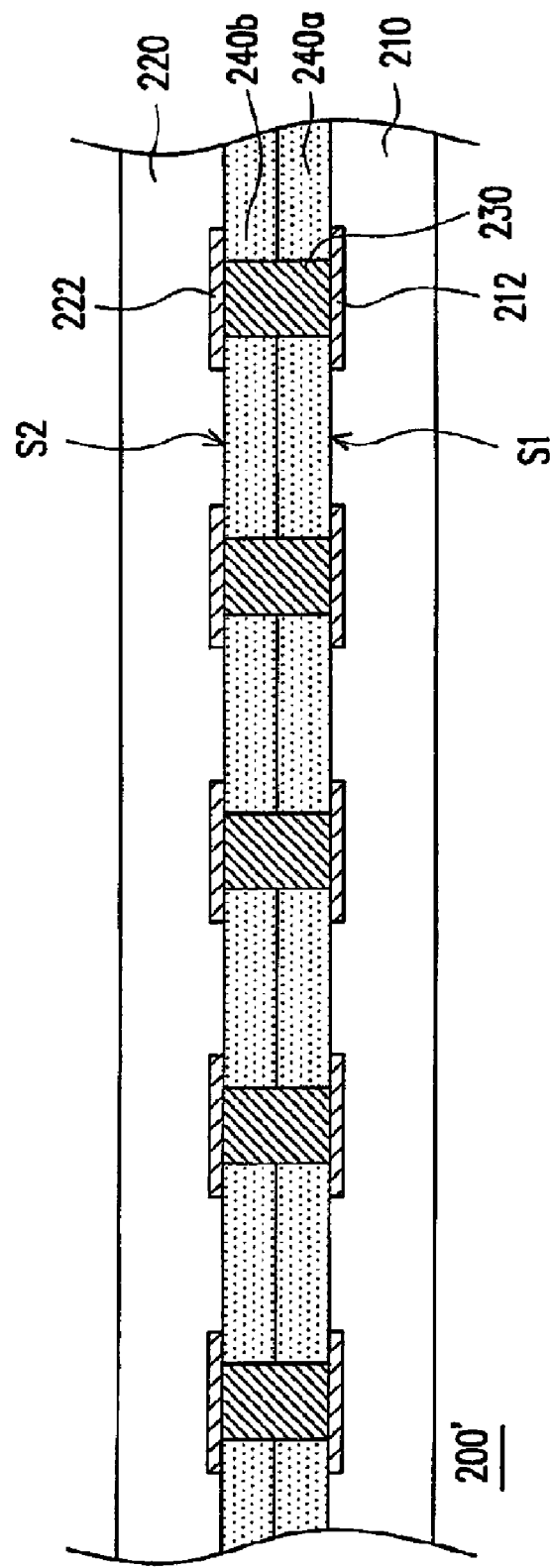

FIG. 3A to FIG. 3D are schematic cross-sectional views illustrating chip package structures according to another embodiment of the present invention. Referring to FIG. 3A and FIG. 3B, the chip package structure 200' of the present embodiment is similar to the chip package structure 200 shown in FIG. 2A and FIG. 2B except that the first B-staged adhesive layer 240a and the second B-staged adhesive layer 240b entirely fill the gaps between the bumps 230. Specifically, the first B-staged adhesive layer 240a and the second B-staged adhesive layer 240b are both non-conductive so as to prevent short circuit between the bumps 230.

Figure 3C:
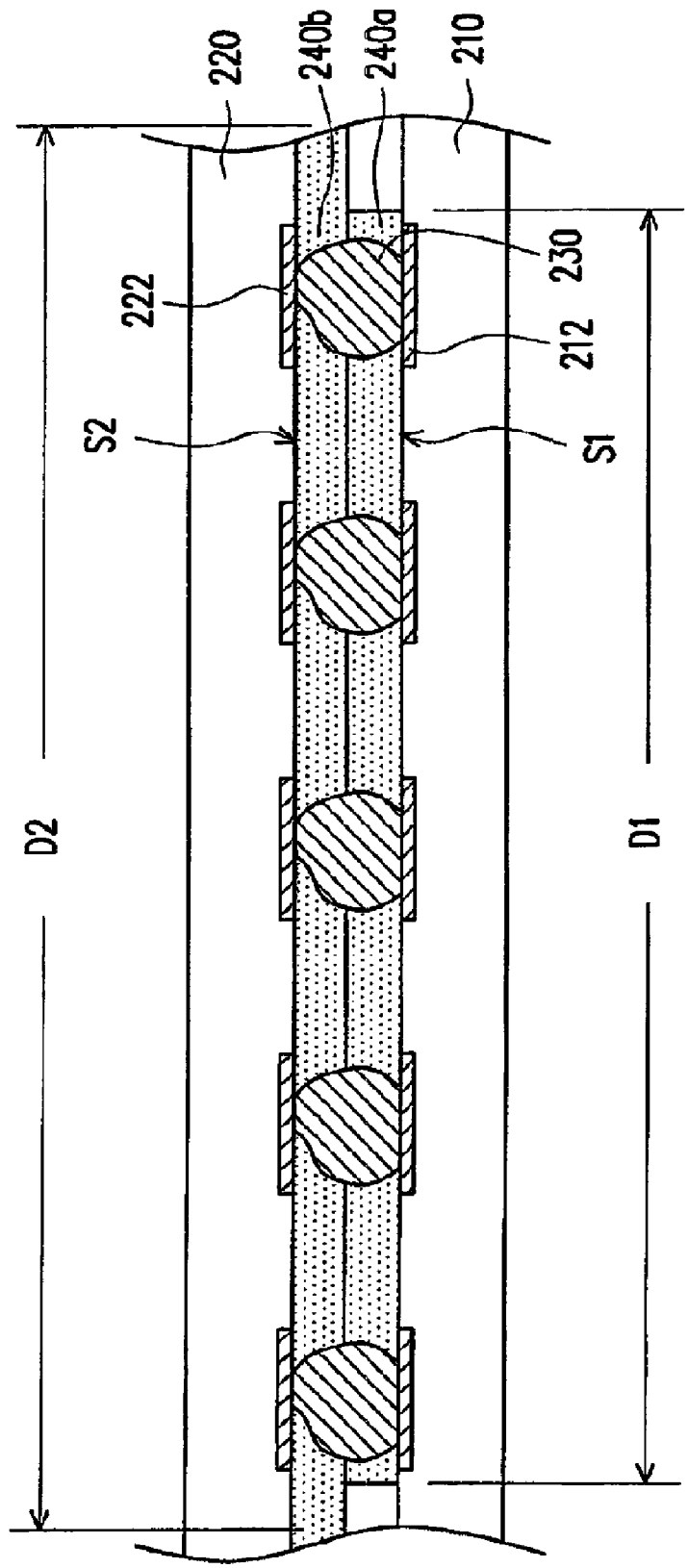

Referring to FIG. 3C, the chip package structure 200" of the present embodiment is similar to the chip package structure 200' shown in FIG. 3A except that the size D1 of the first B-staged adhesive layer 240a is different from the size D2 of the second B-staged adhesive layer 240b. As shown in FIG. 3C, the size D1 of the first B-staged adhesive layer 240a is smaller than the size D2 of the second B-staged adhesive layer 240b such that a portion area of the first substrate 210 is exposed by the first B-staged adhesive layer 240a. The first B-staged adhesive layer 240a entirely covers the surface S1 of the first substrate 210 except areas occupied by the bumps 230, and the second B-staged adhesive layer 240b exposes peripheral region of the surface S2 of the second substrate 220.

Figure 3D:
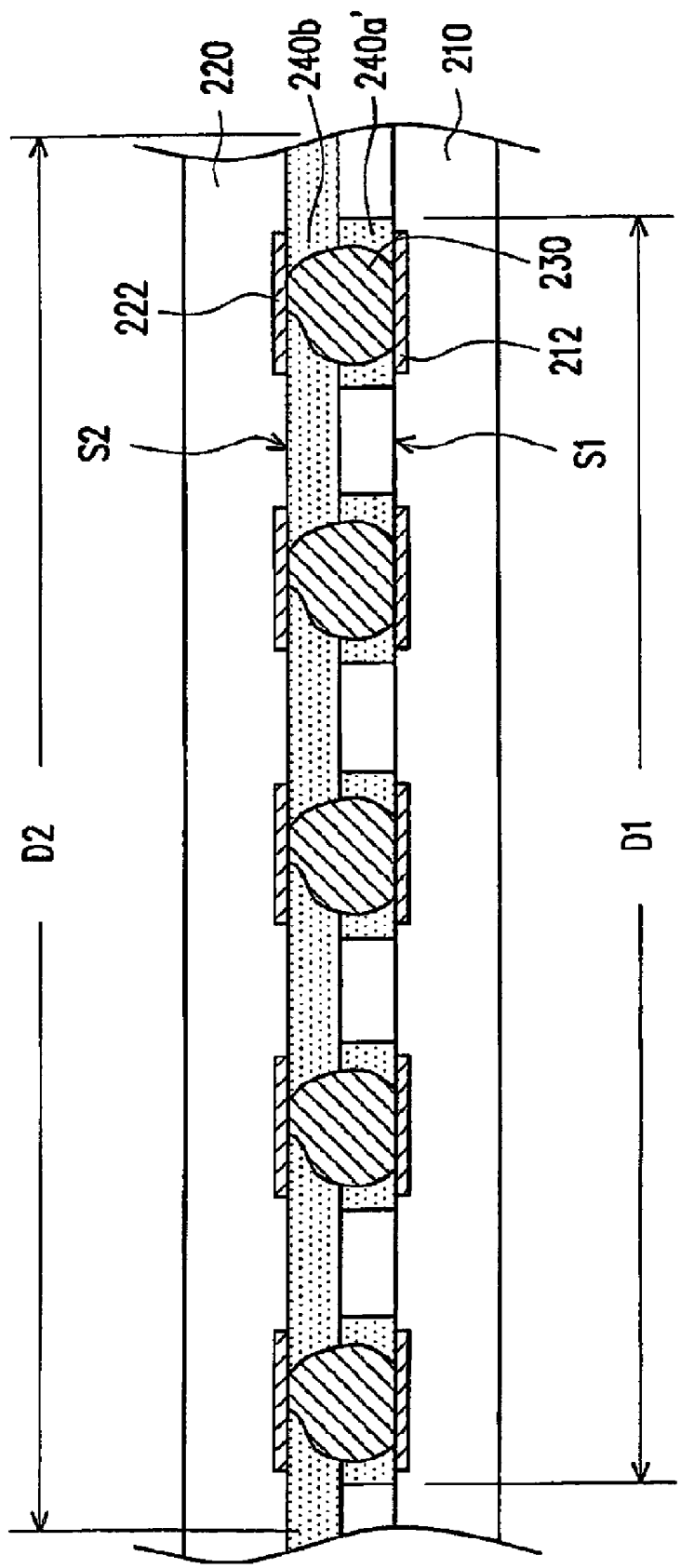

Referring to FIG. 3D, the chip package structure 200''' of the present embodiment is similar to the chip package structure 200" shown in FIG. 3C except that the first B-staged adhesive layer 240a comprises a plurality of first B-staged adhesive pillars 240a'.

Figure 4:
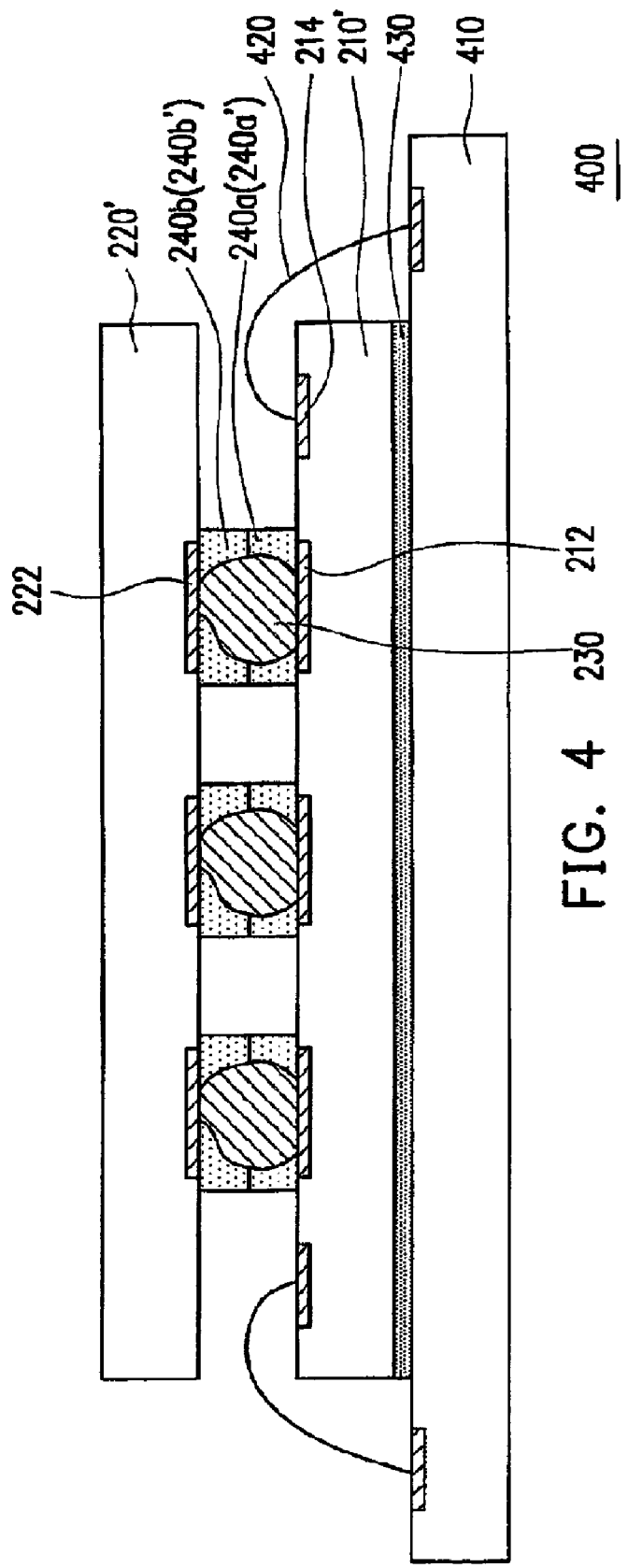
FIG. 4 is a schematic cross-sectional view illustrating a stacked-type chip package structure according to an embodiment of the present invention.

FIG. 4 is a schematic cross-sectional view illustrating a stacked-type chip package structure according to an embodiment of the present invention. Referring to FIG. 4, the stacked-type chip package structure 400 comprises a carrier 410, a first chip 210', a second chip 220', a plurality of bumps 230, a first B-staged adhesive layer 240a, a second B-staged adhesive layer 240b and a plurality of bonding wires 420. The arrangement of the first chip 210', the second chip 220', the bumps 230, the first B-staged adhesive pillars 240a' and the second B-staged adhesive pillars 240b' is substantially the same with the arrangement as shown in FIG. 2A or FIG. 2B. In the present embodiment, the first chip 210' is bonded to the carrier 410 through an adhesive layer 430 (e.g. epoxy, silver paste, DAF, and so on), and is electrically connected to the carrier 410 via the bonding wires 420. Specifically, the first chip 210' has wire bonding pads 214 electrically connected to the carrier 410 via the bonding wires 420. The carrier 410 such as the printed circuit board (PCB). The PCB may be FR4, FR5, BT, PI circuit substrate.

Figure 5:
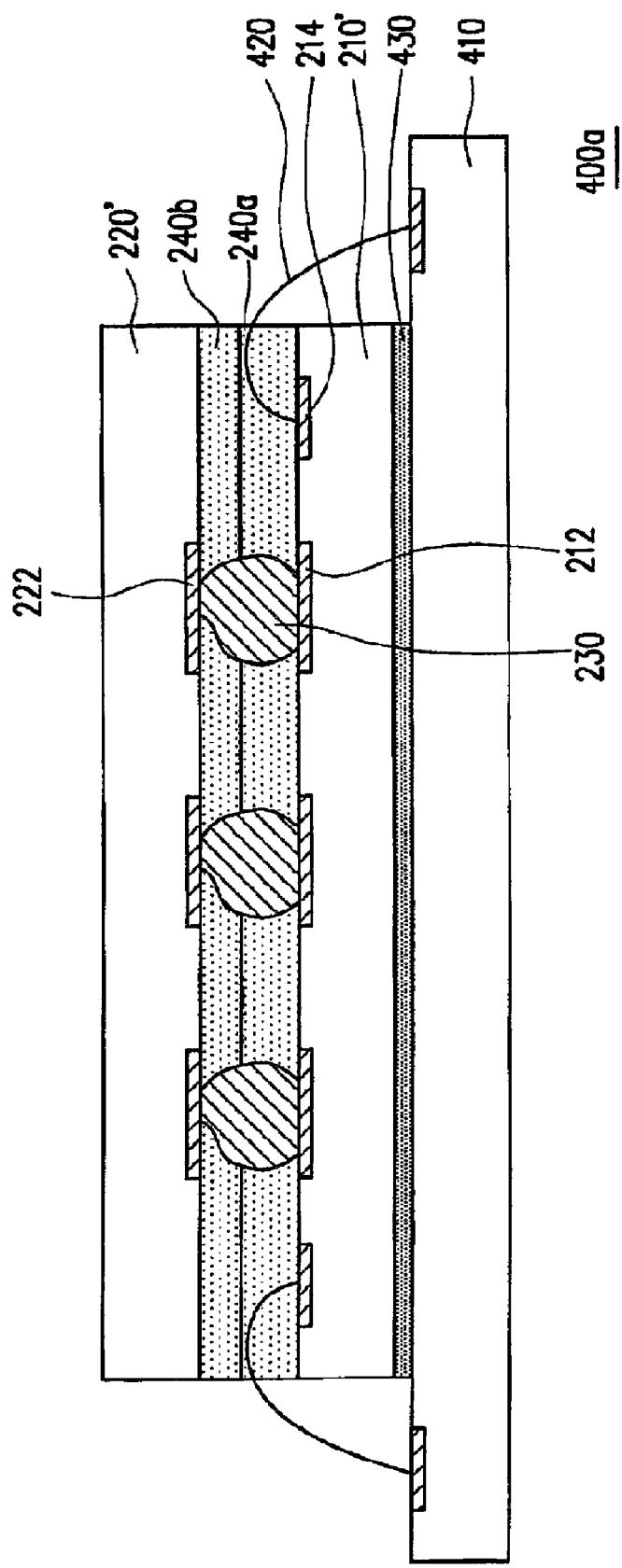
FIGS. 5-7 are schematic cross-sectional views illustrating stacked-type chip package structures according to various embodiments of the present invention.
Figure 6:
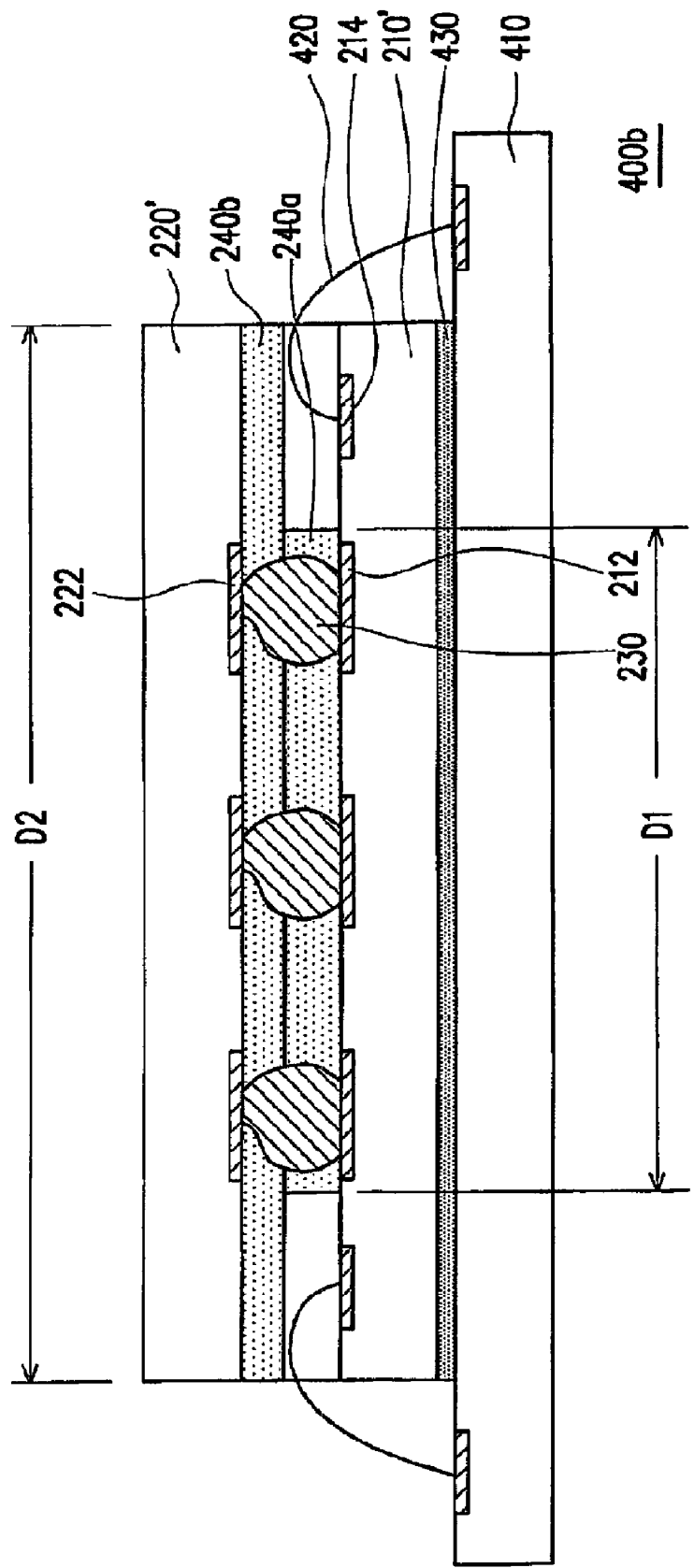
Figure 7:
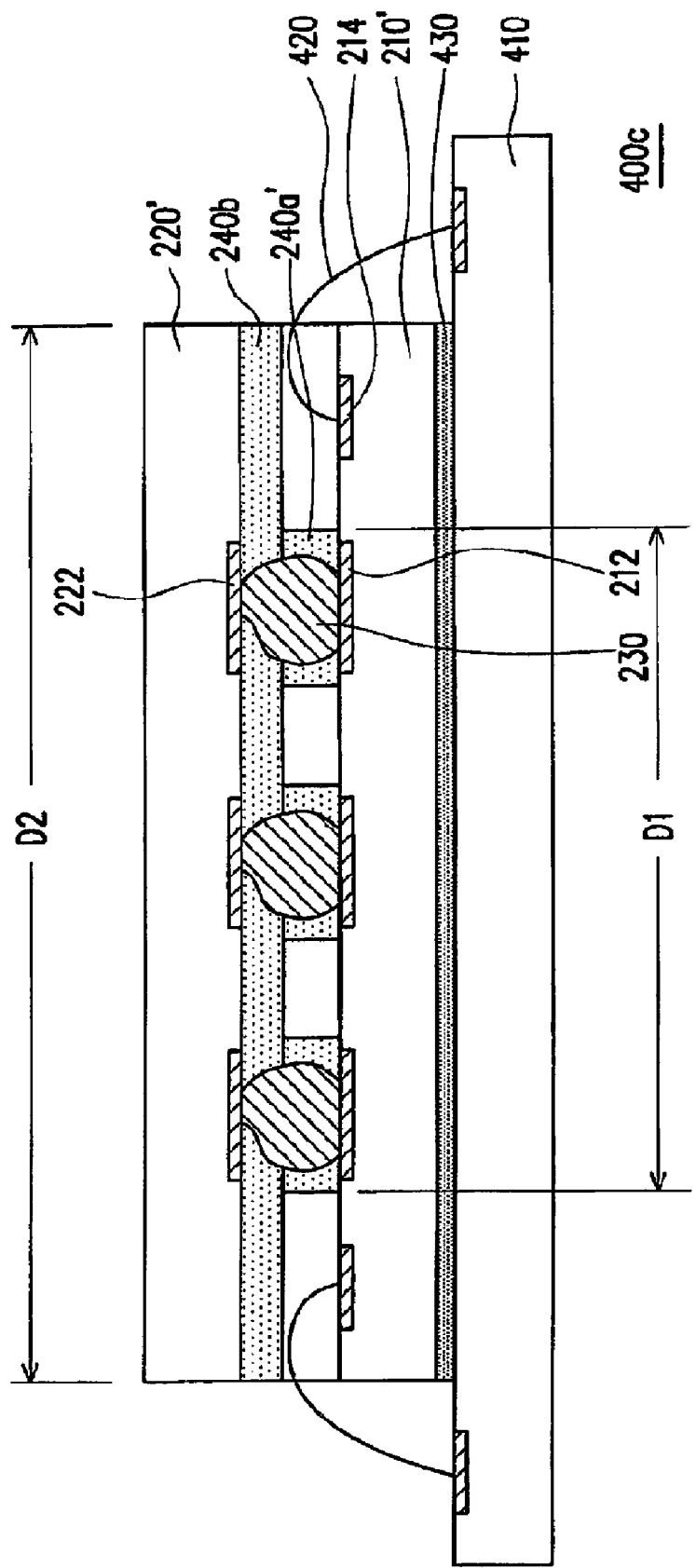

FIGS. 5-7 are schematic cross-sectional views illustrating stacked-type chip package structures according to various embodiments of the present invention. Referring to FIG. 5, the stacked-type chip package structure 400a comprises a carrier 410, a first chip 210', a second chip 220', a plurality of bumps 230, a first B-staged adhesive layer 240a, a second B-staged adhesive layer 240b and a plurality of bonding wires 420. The arrangement of the first chip 210', the second chip 220', the bumps 230, the first B-staged adhesive layer 240a and the second B-staged adhesive layer 240b is substantially the same with the arrangement as shown in FIG. 3A or FIG. 3B. The first chip 210' is bonded to the carrier 410 through an adhesive layer 430 (e.g. epoxy, silver paste, DAF, and so on), and is electrically connected to the carrier 410 via the bonding wires 420. The carrier 410 such as the printed circuit board (PCB). The PCB may be FR4, FR5, BT, PI circuit substrate. Specifically, the first chip 210' has wire bonding pads 214 electrically connected to the carrier 410 via the bonding wires 420. An end of the bonding wires 420 connected to the wire bonding pads 214 is encapsulated by the first B-staged adhesive layer 240a. The stand-off between the first chip 210' and the second chip 220' is maintained by at least one of the first B-staged adhesive layer 240a and the second B-staged adhesive layer 240b, such that the bonding wires 420 can be protected from damage.

Referring to FIG. 6 and FIG. 7, in the stacked-type chip package structure 400b and 400c, the arrangement of the first chip 210', the second chip 220', the bumps 230, the first B-staged adhesive layer 240a and the second B-staged adhesive layer 240b may also be the same as or similar with the above-mentioned embodiments shown in FIG. 3C and FIG. 3D. As shown in FIG. 6 and FIG. 7, wire bonding pads 214 of the first chip 210' are exposed by the first B-staged adhesive layer 240a or the first B-staged adhesive pillars 240a' such that the bonding wires 420 are not encapsulated by the first B-staged adhesive layer 240a or the first B-staged adhesive pillars 240a'.

The fabricating process of the chip package structure 200 illustrated in FIG. 2A is described as followings. It is noted that the fabricating process of the chip package structures 200' illustrated in FIGS. 3A-3B are similar with the fabricating process disclosed in FIGS. 8A to 8D. Therefore, descriptions regarding the fabricating process of the chip package structures 200' illustrated in FIGS. 3A-3B are omitted.

Figure 8A:
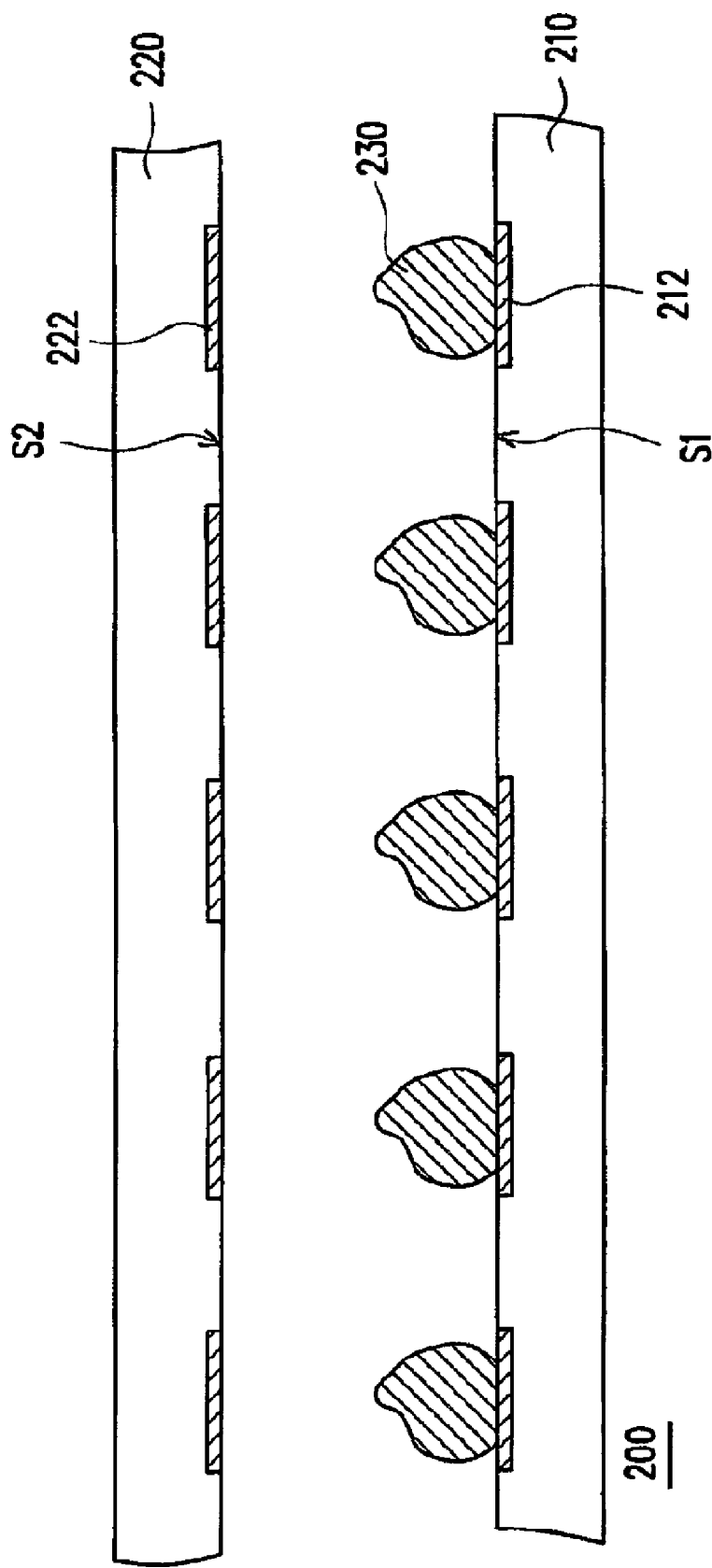
FIGS. 8A to 8D are schematic cross-sectional views illustrating a fabricating process of the chip package structure 200 illustrated in FIG. 2A.

FIGS. 8A to 8D are schematic cross-sectional views illustrating a fabricating process of the chip package structure 200 illustrated in FIG. 2A. Referring to FIG. 8A, a first substrate 210 having a plurality of first bonding pads 212 and a second substrate 220 having a plurality of second bonding pads 222 are provide, wherein a plurality of bumps 230 are formed on the first bonding pads 212 of the first substrate 210. In the present embodiment, the bumps 230 are stud bumps formed by wire bonder similar with the bumps 230a shown in FIG. 2A. In another embodiment, the bumps 230 are plating bumps formed by plating process similar with the bumps 230b shown in FIG. 2B.

In the present embodiment, the first substrate 210 is a carrier, such as the printed circuit board (PCB), and the second substrate 220 is a chip. The PCB may be FR4, FR5, BT, PI circuit substrate. In another embodiment of the present invention, the first substrate 210 and the second substrate 220 can be both chips. In still another embodiment of the present invention, the first substrate 210 may be a chip and the second substrate 220 may be a carrier.

Figure 8B:
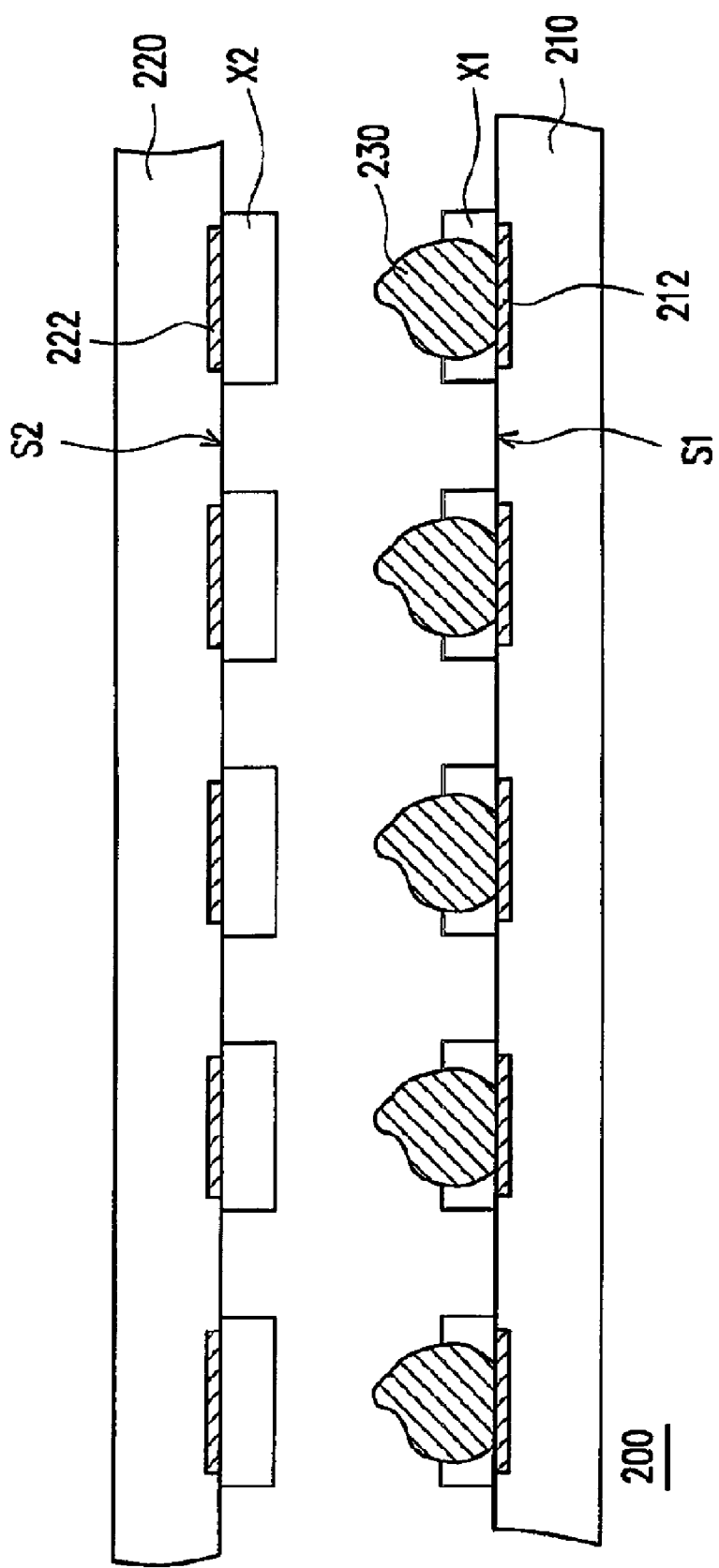
Figure 8C:
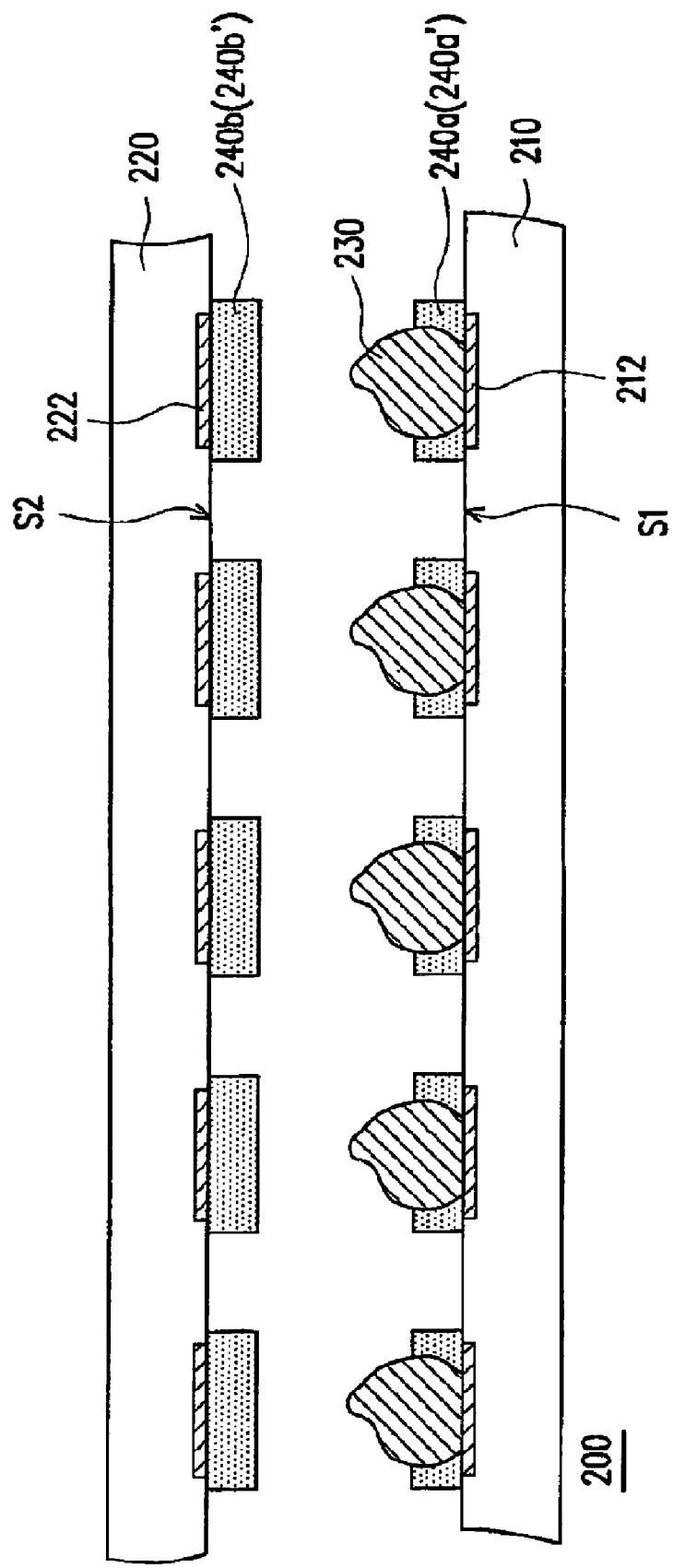

Referring to FIG. 8B and FIG. 8C, a first two-stage adhesive layer X1 is formed on the first substrate 210 and is then B-stagized (i.e. pre-cured or partially cured) to form a first B-staged adhesive layer 240a. A second two-stage adhesive layer X2 is formed on the second substrate 220 and is then B-stagized cured to form a second B-staged adhesive layer 240b. Specifically, the first two-stage adhesive layer X1 and the second two-stage adhesive layer X2 may be B-stagized sequentially. Of course, the first two-stage adhesive layer X1 and the second two-stage adhesive layer X2 may be B-stagized simultaneously. Since the first two-stage adhesive layer X1 and the second two-stage adhesive layer X2 are made from a thermosetting adhesive material with two-stage property, the first B-staged adhesive layer 240a and the second B-staged adhesive layer 240b are formed after the first two-stage adhesive layer X1 and the second two-stage adhesive layer X2 are B-stagized. In the present embodiment, the material of the thermosetting adhesive material with two-stage property may be polyimide, polyquinolin, benzocyclobutene, or the like. Specifically, the first B-staged adhesive layer 240a and the second B-staged adhesive layer 240b can be obtained from 8008 or 8008HT of ABLESTIK, and the glass transition temperature of which is between about 80° C. and about 300° C. Additionally, the first B-staged adhesive layer 240a and the second B-staged adhesive layer 240b can be obtained from 6200, 6201 or 6202C of ABLESTIK or obtained from SA-200-6, SA-200-10 provided by HITACHI Chemical CO., Ltd., and the glass transition temperature of which is between about −40° C. and about 150° C. Preferably, the glass transition temperature of the first B-staged adhesive layer 240a is greater than, equal to or smaller than the glass transition temperature of the second B-staged adhesive layer 240b. Additionally, some conductive particles (e.g. silver particles, copper particles, gold particles) are doped in the first B-staged adhesive layer 240a and the second B-staged adhesive layer 240b, for example.

Besides, the thermosetting adhesive material with two-stage property can be conductive or non-conductive, and they can be formed by screen printing, painting, spraying, spin-coating, or dipping. In this step, the thermosetting adhesive material with two-stage property may be in liquid or gel state such that the can be easy to spread on the first substrate 210 and the second substrate 220. The type of the thermosetting adhesive material is not limited in the present invention.

Figure 8D:
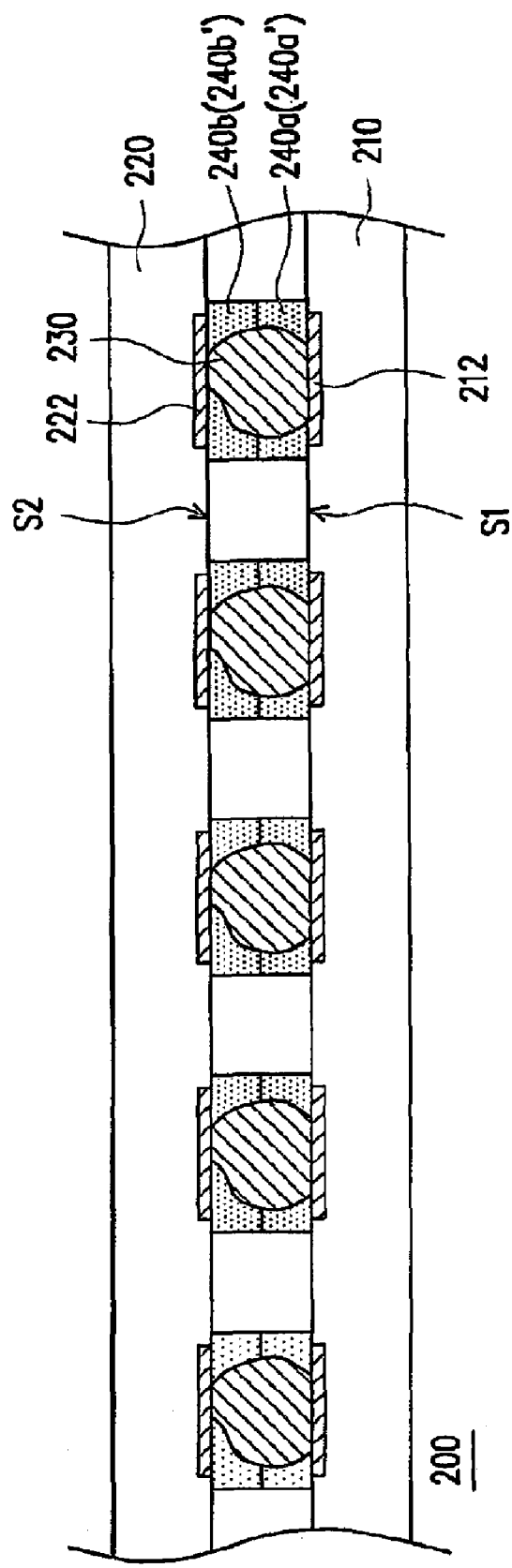

Referring to FIG. 8D, after the first B-staged adhesive layer 240a and the second B-staged adhesive layer 240b are formed, the first substrate 210 and the second substrate 220 are bonded via the first B-staged adhesive layer 240a and the second B-staged adhesive layer 240b such that each of the first bonding pads 212 is respectively electrically connected to one of the second bonding pads 222 via one of the bumps 230. Specifically, the first B-staged adhesive layer 240a and the second B-staged adhesive layer 240b are bonded with each other by further curing the first B-staged adhesive layer 240a and the second B-staged adhesive layer 240b. If necessary, a post-curing process may be performed after the first B-staged adhesive layer 240a and the second B-staged adhesive layer 240b are fully cured.

In order to ensure the electrical connection between the first substrate 210 and the second substrate 220, the thickness of the first B-staged adhesive layer 240a and the thickness of the second B-staged adhesive layer 240b should be carefully controlled such that the bumps 230 are capable of piercing the second B-staged adhesive layer 240b and connecting with the second bonding pads 222 of the second substrate 220. In the present embodiment, the thickness of the first B-staged adhesive layer 240a is substantially equal to the thickness of the second B-staged adhesive layer 240b. However, base on actual design requirements, the thickness of the first B-staged adhesive layer 240a may also be different from that of the second B-staged adhesive layer 240b.

Figure 9:
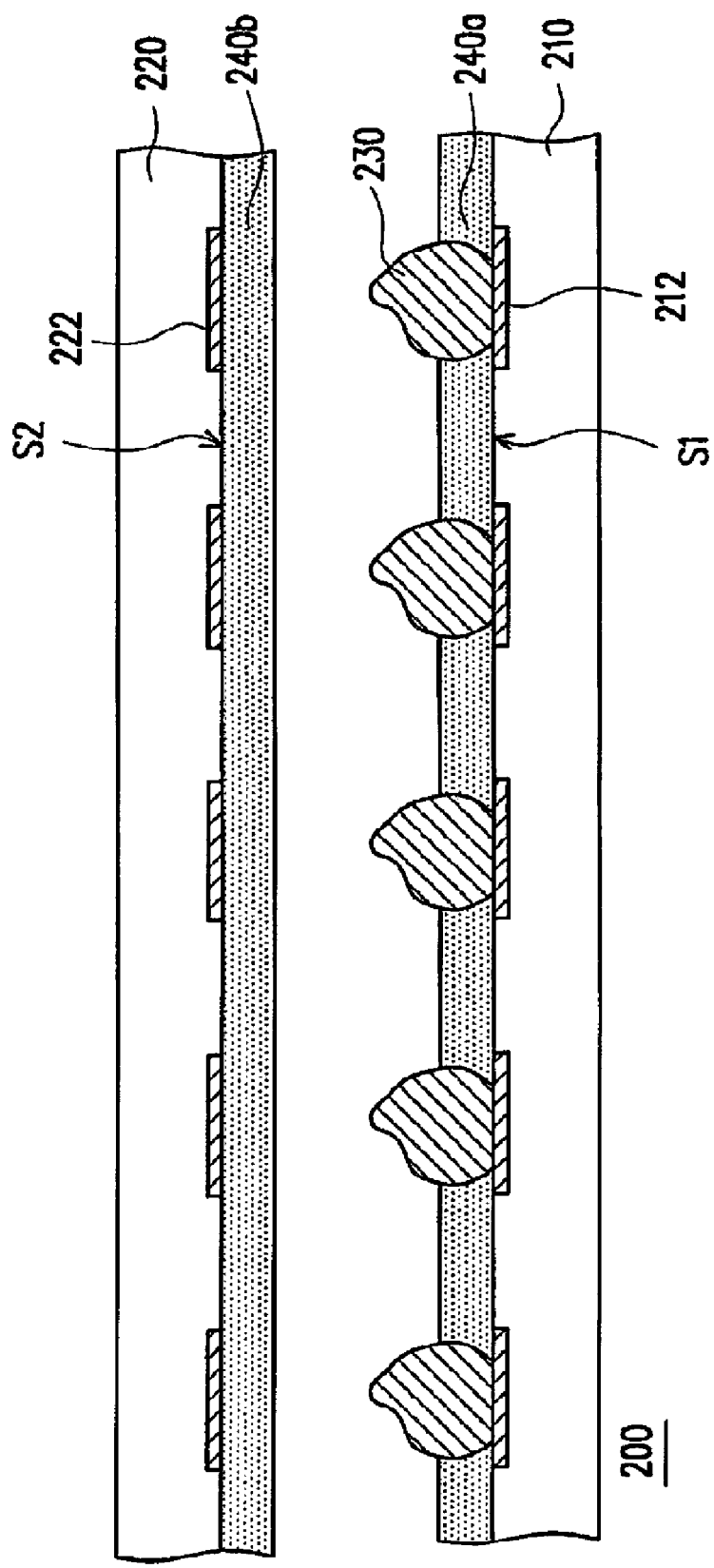
FIG. 9 and FIG. 10 are schematic cross-sectional views illustrating the first substrate and the second substrate according to another embodiment of the present invention.

According to the present embodiment, the method for forming the first B-staged adhesive layer 240a comprises forming a plurality of first two-stage adhesive pillars to surround the bumps 230 and B-stagizing the first two-stage adhesive pillars to form a plurality of first B-staged adhesive pillars 240a'. Additionally, the method for forming the second B-staged adhesive layer 240b comprises forming a plurality of second two-stage adhesive pillars on the second bonding pads 222 and B-stagizing the second two-stage adhesive pillars to form a plurality of second B-staged adhesive pillars 240b'. However, as shown in FIG. 9, the first B-staged adhesive layer 240a may be formed to entirely fill the gaps between the bumps 230 and the second B-staged adhesive layer 240b may be formed to entirely cover the surface S1 of the first substrate 210 except areas occupied by the bumps 230.

Figure 10:
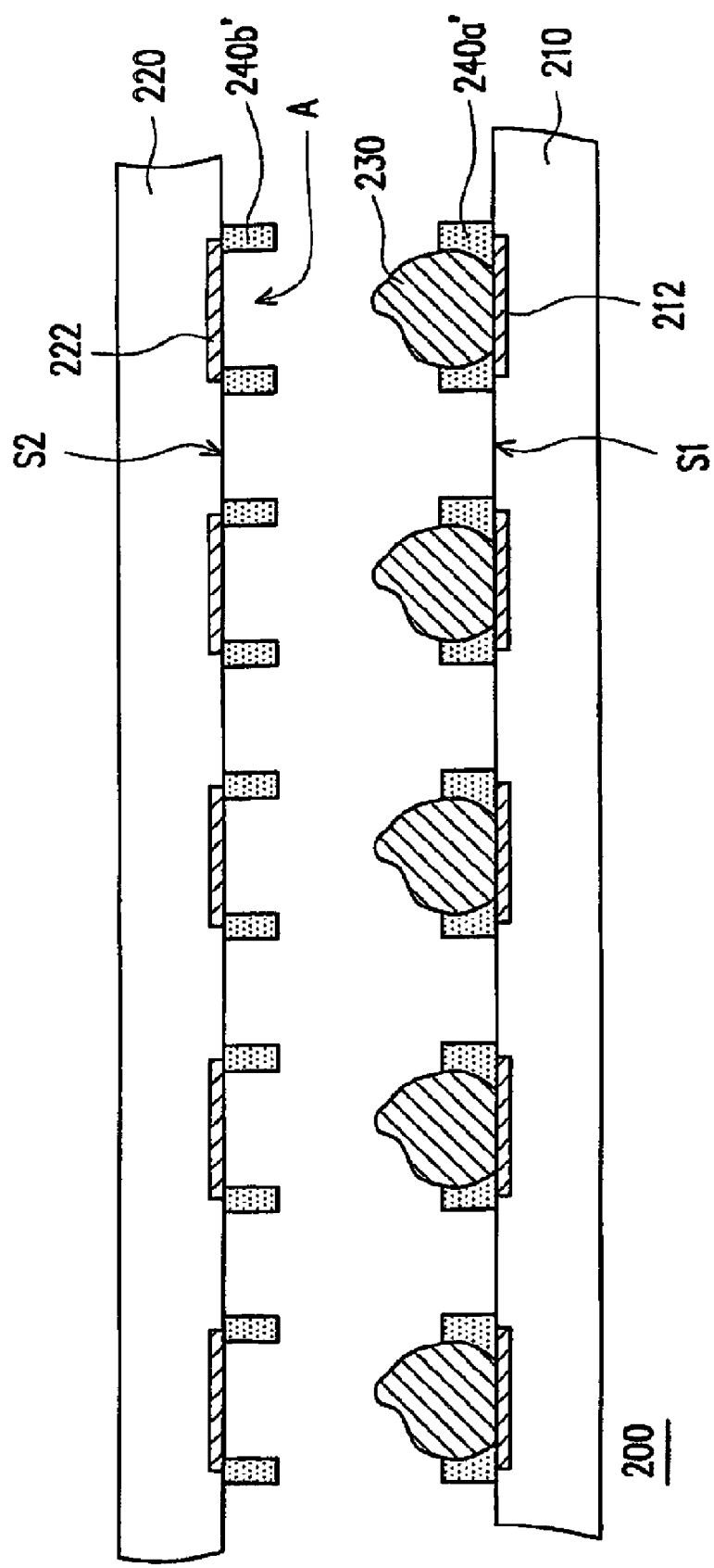

FIG. 10 is a schematic cross-sectional view illustrating the first substrate and the second substrate according to another embodiment of the present invention. In the present embodiment, each of second B-staged adhesive pillars 240b' is a hollow pillar having an aperture A for exposing one of the second bonding pads 222 of the second substrate 220, respectively. Specifically, the first B-staged adhesive pillars 240a' are conductive while the second B-staged adhesive pillars 240b' are conductive or non-conductive. In another embodiment, the first B-staged adhesive pillars 240a' are non-conductive while the second B-staged adhesive pillars 240b' are conductive or non-conductive.

The first B-staged adhesive layer 240a and the second B-staged adhesive layer 240b may be formed by other manners. The patterns of the first B-staged adhesive layer 240a and the second B-staged adhesive layer 240b are not limited in the present invention. Two kinds of fabricating processes are illustrated as followings.

Figure 11:
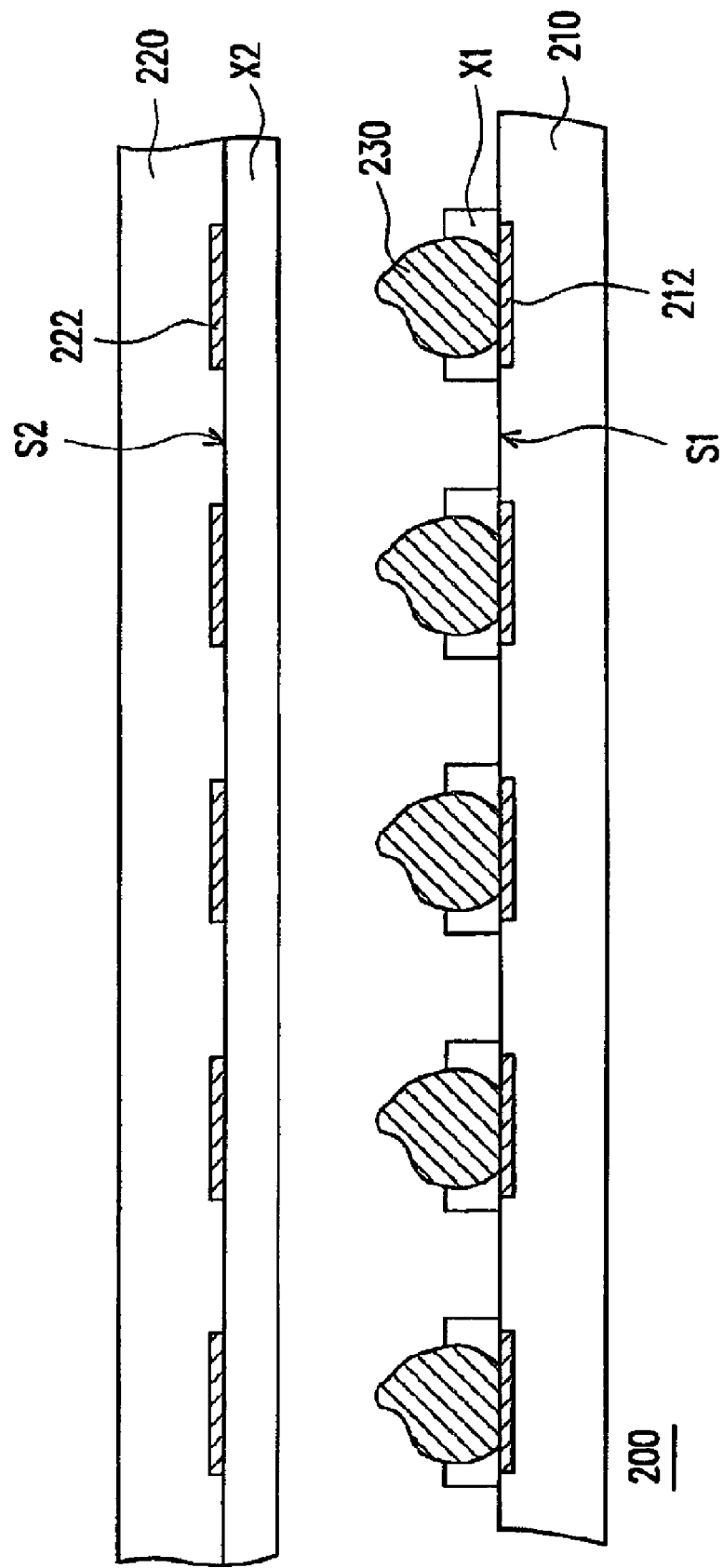
FIG. 11 and FIG. 12 are schematic cross-sectional views illustrating the first substrate and the second substrate according to still another embodiment of the present invention.
Figure 12:
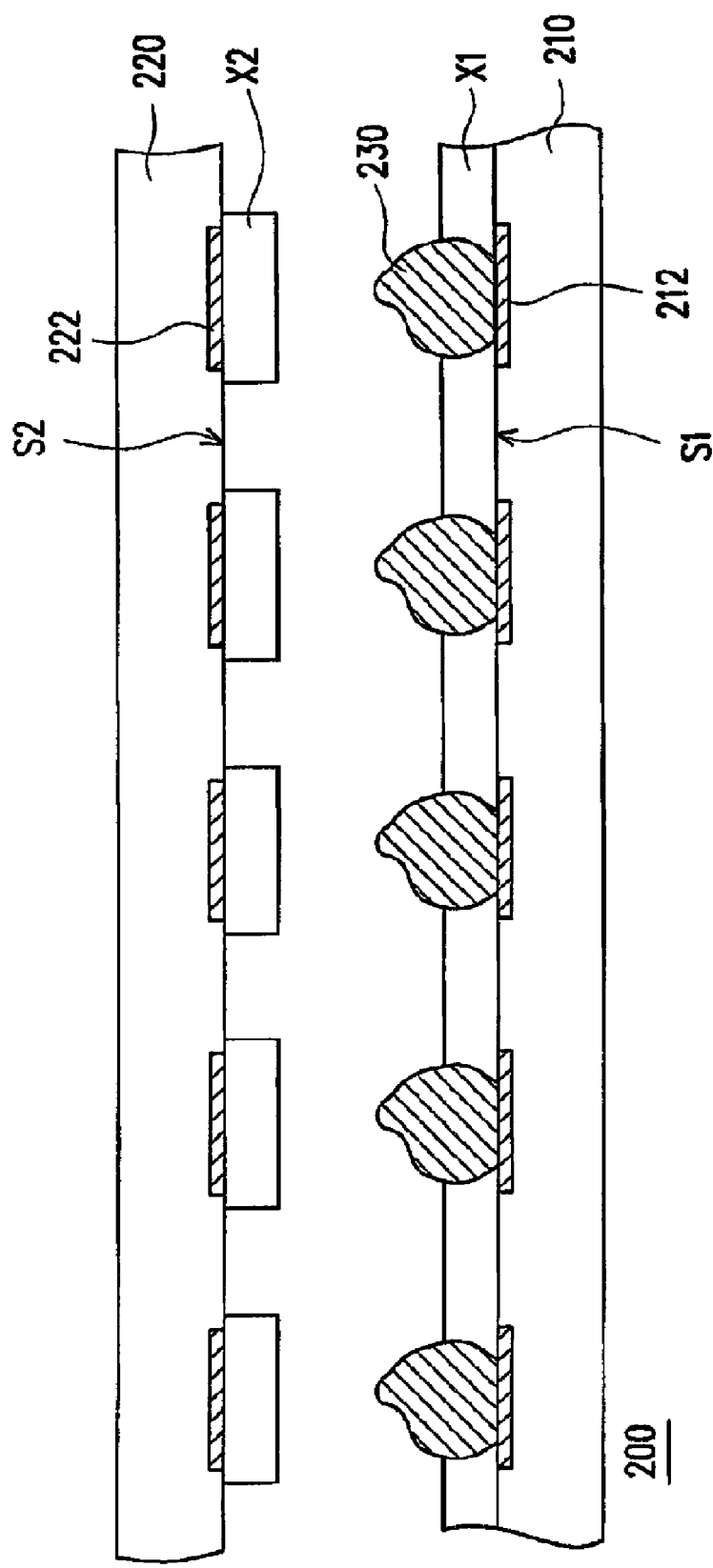

FIG. 11 and FIG. 12 are schematic cross-sectional views illustrating the first substrate and the second substrate according to still another embodiment of the present invention. Referring to FIG. 11, in the present embodiment, the second two-stage adhesive layer X2 is entirely formed on the second substrate 220. Additionally, the first two-stage adhesive layer X1 including a plurality of first two-stage adhesive pillars is formed to surround the bumps 230. Then, the first two-stage adhesive layer X1 and the second two-stage adhesive layer X2 are B-stagized by heating or UV curing.

Referring to FIG. 12, in another embodiment of the present invention, the first two-stage adhesive layer X1 entirely covers the first substrate 210 except areas occupied by the bumps 230. Additionally, the second two-stage adhesive layer X2 including a plurality of second two-stage adhesive pillars is formed on the second bonding pads 222 of the second substrate 220. Then, the first two-stage adhesive layer X1 and the second two-stage adhesive layer X2 are B-stagized by heating or UV curing.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating process of a chip package structure, comprising:
   providing a first substrate having a plurality of first bonding pads;
   providing a second substrate having a plurality of second bonding pads;
   forming a plurality of bumps on the first bonding pads of the first substrate;
   forming a first two-stage adhesive layer on the first substrate;
   B-stagizing the first two-stage adhesive layer to form a first B-staged adhesive layer, wherein a method for forming the first B-staged adhesive layer comprises:
   forming a plurality of first two-stage adhesive pillars to surround the bumps;
   B-stagizing the first two-stage adhesive pillars to form a plurality of first B-staged adhesive pillars;
   forming a second two-stage adhesive layer on the second substrate;
   B-stagizing the second two-stage adhesive layer to form a second B-staged adhesive layer, wherein a method for forming the second B-staged adhesive layer comprises:
   forming a plurality of second two-stage adhesive pillars on the second bonding pads, wherein each of the second bonding pads is entirely covered by one of the second two-stage adhesive pillars, respectively;
   B-stagizing the second two-stage adhesive pillars to form a plurality of second B-staged adhesive pillars; and
   bonding the first substrate and the second substrate via the first B-staged adhesive layer and the second B-staged adhesive layer such that the bumps pierce through the second B-staged adhesive layer and are electrically connected to the second bonding pads, wherein each of the first bonding pads is respectively electrically connected to one of the second bonding pads via one of the bumps.

2. The fabricating process of a chip package structure according to claim 1, wherein the first substrate and the second substrate are both chips.

3. The fabricating process of a chip package structure according to claim 1, wherein the first substrate is a carrier and the second substrate is a chip.

4. The fabricating process of a chip package structure according to claim 1, wherein the first substrate is a chip and the second substrate is a carrier.

5. The fabricating process of a chip package structure according to claim 1, wherein the bumps are stud bumps formed by wire bonder or plating bumps formed by plating process.

6. The fabricating process of a chip package structure according to claim 1, wherein the first two-stage adhesive layer is formed by screen printing, painting, spraying, spin-coating, or dipping.

7. The fabricating process of a chip package structure according to claim 1, wherein the second two-stage adhesive layer is formed by screen printing, painting, spraying, spin-coating, or dipping.

8. The fabricating process of a chip package structure according to claim 1, wherein the first B-staged adhesive pillars are conductive.

9. The fabricating process of a chip package structure according to claim 1, wherein the first B-staged adhesive pillars are non-conductive.

10. The fabricating process of a chip package structure according to claim 1, wherein a glass transition temperature of the first B-staged adhesive layer is greater than, equal to or smaller than a glass transition temperature of the second B-staged adhesive layer.

11. The fabricating process of a chip package structure according to claim 1, wherein composition of the first B-staged adhesive layer is substantially the same with that of the second B-staged adhesive layer.

12. The fabricating process of a chip package structure according to claim 1, wherein the first two-stage adhesive layer and the second two-stage adhesive layer are B-stagized sequentially to form the first B-staged adhesive layer and the second B-staged adhesive layer.

13. The fabricating process of a chip package structure according to claim 1, wherein the first two-stage adhesive layer and the second two-stage adhesive layer are B-stagized simultaneously to form the first B-staged adhesive layer and the second B-staged adhesive layer.

14. The fabricating process of a chip package structure according to claim 1, wherein a method for B-stagizating the first two-stage adhesive layer and the second two-stage adhesive layer comprises heating or UV curing.

15. The fabricating process of a chip package structure according to claim 8, wherein the second B-staged adhesive pillars are conductive.

16. The fabricating process of a chip package structure according to claim 8, wherein the second B-staged adhesive pillars are non-conductive.

17. The fabricating process of a chip package structure according to claim 9, wherein the second B-staged adhesive pillars are conductive.

18. The fabricating process of a chip package structure according to claim 9, wherein the second B-staged adhesive pillars are non-conductive.

19. A fabricating process of a chip package structure, comprising:
   providing a first substrate having a plurality of first bonding pads;
   providing a second substrate having a plurality of second bonding pads;
   forming a plurality of bumps on the first bonding pads of the first substrate;
   forming a first two-stage adhesive layer on the first substrate;
   B-stagizing the first two-stage adhesive layer to form a first B-staged adhesive layer, wherein a method for forming the first B-staged adhesive layer comprises:

forming a plurality of first two-stage adhesive pillars to surround the bumps;

B-stagizing the first two-stage adhesive pillars to form a plurality of first B-staged adhesive pillars;

forming a second two-stage adhesive layer on the second substrate, wherein the second two-stage adhesive layer entirely covers the second substrate;

B-stagizing the second two-stage adhesive layer to form a second B-staged adhesive layer; and bonding the first substrate and the second substrate via the first B-staged adhesive layer and the second B-staged adhesive layer such that the bumps pierce through the second B-staged adhesive layer and are electrically connected to the second bonding pads, wherein each of the first bonding pads is respectively electrically connected to one of the second bonding pads via one of the bumps.

20. The fabricating process of a chip package structure according to claim 19, wherein the second B-staged adhesive pillars are non-conductive.

21. The fabricating process of a chip package structure according to claim 19, wherein the first two-stage adhesive layer and the second two-stage adhesive layer are B-stagized sequentially or simultaneously to form the first B-staged adhesive layer and the second B-staged adhesive layer.

22. The fabricating process of a chip package structure according to claim 20, wherein the first two-stage adhesive layer is conductive.

23. The fabricating process of a chip package structure according to claim 20, wherein the first two-stage adhesive layer is non-conductive.

* * * * *